(12) United States Patent
Kumagai

(10) Patent No.: US 7,731,417 B2
(45) Date of Patent: Jun. 8, 2010

(54) TEMPERATURE DETECTION CIRCUIT

(75) Inventor: Toshiyuki Kumagai, Itami (JP)

(73) Assignee: Mitsubishi Electric Corporation, Tokyo (JP)

( * ) Notice: Subject to any disclaimer, the term of this patent is extended or adjusted under 35 U.S.C. 154(b) by 378 days.

(21) Appl. No.: 11/774,787

(22) Filed: Jul. 9, 2007

(65) Prior Publication Data
US 2008/0238529 A1 Oct. 2, 2008

(30) Foreign Application Priority Data
Mar. 29, 2007 (JP) ................ 2007-088108

(51) Int. Cl.
G01K 15/00 (2006.01)
G01K 7/00 (2006.01)
(52) U.S. Cl. .......................... 374/1; 374/185
(58) Field of Classification Search .............. 374/1, 374/183; 327/512
See application file for complete search history.

(56) References Cited
U.S. PATENT DOCUMENTS

| | | | | |
|---|---|---|---|---|
| 4,395,139 | A * | 7/1983 | Namiki et al. ............ | 374/178 |
| 7,044,633 | B2 * | 5/2006 | Clabes et al. ............. | 374/1 |
| 7,075,353 | B1 * | 7/2006 | Wan et al. ................ | 327/295 |
| 7,356,426 | B2 * | 4/2008 | Jain et al. ................ | 702/99 |
| 7,417,487 | B2 * | 8/2008 | Mori ........................ | 327/512 |
| 2008/0031304 | A1 * | 2/2008 | Nishimura ............... | 374/178 |
| 2008/0135397 | A1 * | 6/2008 | Ehrfeld et al. ........... | 204/157.15 |
| 2008/0291970 | A1 * | 11/2008 | Franch et al. ............ | 374/178 |

FOREIGN PATENT DOCUMENTS

| | | |
|---|---|---|
| JP | 2001-298160 | 10/2001 |
| JP | 2002-148288 | 5/2002 |
| JP | 2004-85384 | 3/2004 |

* cited by examiner

Primary Examiner—Gail Verbitsky
Assistant Examiner—Mirellys Jagan
(74) Attorney, Agent, or Firm—Oblon, Spivak, McClelland, Maier & Neustadt, L.L.P (57) ABSTRACT

A PWM signal generation circuit in an IPM includes an amplification circuit amplifying a voltage across terminals of a temperature sensor, a comparison circuit generating a PWM signal based on a triangular wave signal and an output signal of the amplification circuit, and a correction circuit setting an amplification ratio of the amplification circuit such that a pulse width of the PWM signal is set to a reference pulse width in an adjustment mode in which a switching element is caused to have a reference temperature. Consequently, characteristic variations in the temperature sensor, the amplification circuit, and the like can be corrected, and the temperature of the switching element can be detected with high accuracy.

8 Claims, 9 Drawing Sheets

TEMPERATURE DETECTION CIRCUIT

BACKGROUND OF THE INVENTION

1. Field of the Invention

The present invention relates to a temperature detection circuit, and in particular to a temperature detection circuit connected to a temperature sensor having a resistance varying in accordance with a temperature of a switching element.

2. Description of the Background Art

Conventionally, Intelligent Power Modules (hereinafter referred to as IPMs) having therein a switching element such as an Insulated Gate Bipolar Transistor (hereinafter referred to as an IGBT) and a control circuit for the switching element have been developed.

The IPM is also provided with a temperature sensor and a temperature detection circuit for preventing thermal failure of the switching element due to heat generated when current flows therethrough. The temperature sensor is provided on a chip on which the switching element is provided, and has a resistance varying with temperature. The temperature detection circuit is connected to the temperature sensor and outputs a signal indicating a temperature of the switching element. When it is detected based on the signal output from the temperature detection circuit that the temperature of the switching element reaches a predetermined upper limit, the control circuit controls voltage to be applied to a control electrode of the switching element and limits principal current, thus preventing thermal failure of the switching element.

Further, there is also a method of detecting a current value of a switching element based on a signal output from a temperature detection circuit and controlling principal current of the switching element based on the result of the detection (see for example Japanese Patent Laying-Open No. 2002-148288).

In a conventional temperature detection circuit, however, many electronic components constituting the temperature detection circuit each have characteristic variations, and the temperature sensor also has characteristic variations. This results in poor accuracy in temperature detection, and also causes variations in the accuracy of temperature detection among a plurality of IPMs.

SUMMARY OF THE INVENTION

Accordingly, a main object of the present invention is to provide a temperature detection circuit capable of detecting a temperature of a switching element with high accuracy.

A temperature detection circuit in accordance with the present invention is a temperature detection circuit connected to a temperature sensor having a resistance varying in accordance with a temperature of a switching element, including a signal generation circuit outputting a signal indicating the temperature of the switching element based on the resistance of the temperature sensor and a correction value, and a correction circuit setting the correction value such that, in an adjustment mode in which the switching element is caused to have a predetermined reference temperature, the signal output from the signal generation circuit indicates the reference temperature. Consequently, errors due to characteristic variations in the electronic components and the temperature sensor can easily be corrected, and the temperature of the switching element can be detected with high accuracy.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
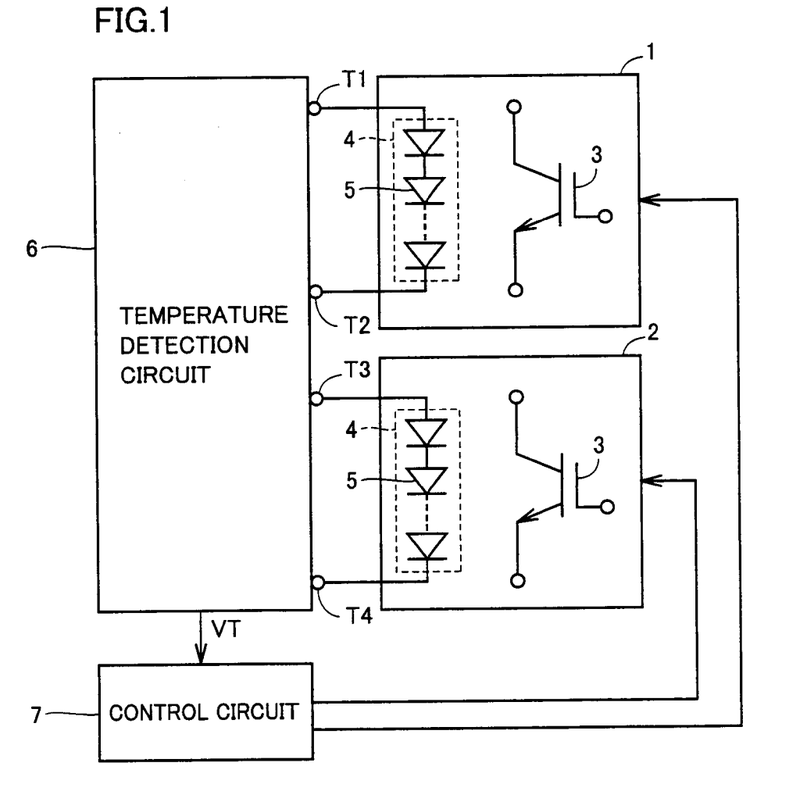
FIG. 1 is a circuit block diagram showing a structure of an IPM in accordance with a first embodiment of the present invention.

FIG. 1 is a circuit block diagram showing an IPM in accordance with a first embodiment of the present invention. In FIG. 1, the IPM includes a plurality of (two in the drawing) chips 1 and 2, a temperature detection circuit 6, and a control circuit 7. Each of chips 1 and 2 is provided with a switching element 3 and a temperature sensor 4. Since chips 1 and 2 (switching element 3 and temperature sensor 4) having substantially identical characteristics are generally selected and used within one IPM, characteristic variations in temperature sensors 4 within one IPM are negligible. Switching element 3, for example an IGBT, is connected between a power source and a load circuit, and controlled by a gate drive signal output from control circuit 7 to be turned ON/OFF to supply/block current to the load circuit.

Temperature sensor 4 includes a plurality of diodes 5 connected in series. When current flows through switching element 3 and heat is generated, the heat increases temperatures of switching element 3 and temperature sensor 4. As the temperature of temperature sensor 4 increases, a resistance of temperature sensor 4 is reduced. Of two temperature sensors 4, one temperature sensor 4 is connected between a terminal T1 and a terminal T2 of temperature detection circuit 6, and the other temperature sensor 4 is connected between a terminal T3 and a terminal T4 of temperature detection circuit 6.

In a normal mode, temperature detection circuit 6 selectively generates a temperature voltage VT indicating the higher of the temperatures of two switching elements 3, based on the resistances of two temperature sensors 4. Temperature detection circuit 6 also has a function of correcting characteristic variations among IPMs such as in temperature sensors 4 for the purpose of highly accurate temperature detection (adjustment mode). This correction function will be described later. When temperature voltage VT increases and reaches a predetermined upper limit, control circuit 7 controls voltage to be applied to a control electrode of each switching element 3 and limits principal current, thus preventing thermal failure of switching element 3.

Figure 2:
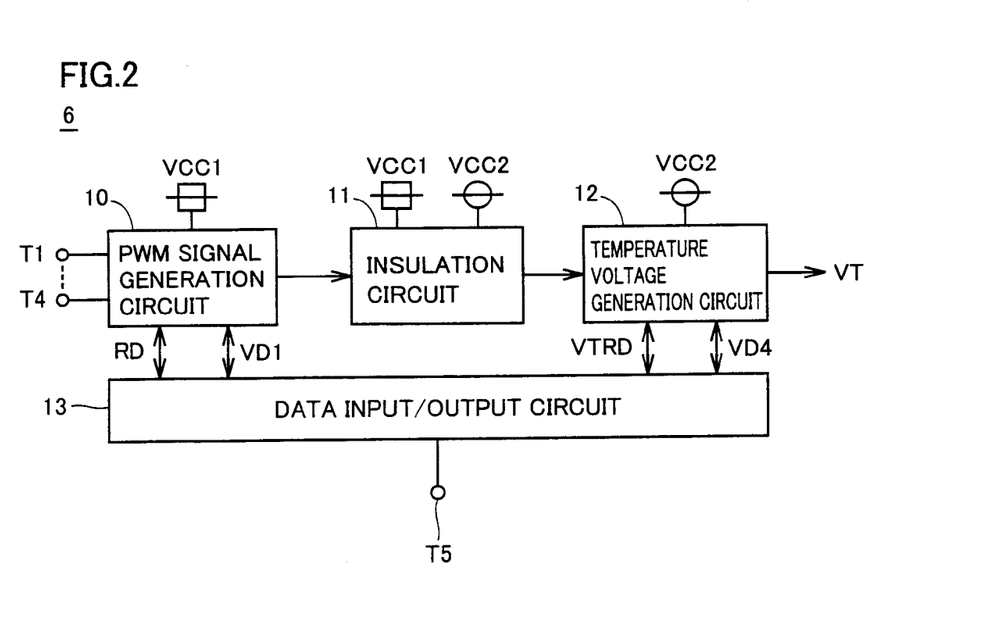
FIG. 2 is a block diagram showing a structure of a temperature detection circuit shown in FIG. 1.

FIG. 2 is a block diagram showing a structure of temperature detection circuit 6. In FIG. 2, temperature detection circuit 6 includes a PWM signal generation circuit 10, an insulation circuit 11, a temperature voltage generation circuit 12, a data input/output circuit 13, and a data input/output terminal T5. It is to be noted that the adjustment mode in temperature detection circuit 6 includes pulse width correction for PWM signal generation circuit 10 and temperature voltage correction for temperature voltage generation circuit 12.

PWM signal generation circuit 10 is driven by a first power supply voltage VCC1. PWM signal generation circuit 10 converts the resistances of two temperature sensors 4 into voltages, selects the lower of the two voltages indicating a higher temperature, amplifies the selected voltage, and converts the amplified voltage into a PWM signal. Further, PWM signal generation circuit 10 includes two storage circuits setting (storing) data signals RD and VD1 for correcting a pulse width of the PWM signal to a reference pulse width in the adjustment mode (pulse width correction) in which switching element 3 is caused to have a predetermined reference temperature. In the adjustment mode, the entire IPM is accommodated in a constant-temperature bath and caused to have the predetermined reference temperature.

Insulation circuit 11 transmits the PWM signal generated in PWM signal generation circuit 10 driven by the first power supply voltage VCC1, via a built-in photocoupler, to temperature voltage generation circuit 12 driven by a second power supply voltage VCC2.

Temperature voltage generation circuit 12, driven by the second power supply voltage VCC2, demodulates the PWM signal supplied via insulation circuit 11 and converts it into an analog voltage, and then amplifies the analog voltage to output temperature voltage VT. Further, temperature voltage generation circuit 12 includes two storage circuits setting (storing) data signals VTRD and VD4 for correcting temperature voltage VT to a reference voltage VR in the adjustment mode (temperature voltage correction). Data signals VTRD and VD4 are each rewritable and readable.

Data input/output circuit 13 transmits and receives data signals RD and VD1 between PWM signal generation circuit 10 and data input/output terminal T5, and also transmits and receives data signals VTRD and VD4 between temperature voltage generation circuit 12 and data input/output terminal T5. Accordingly, data signals RD, VD1, VTRD, and VD4 are each externally rewritable and readable.

Figure 3:
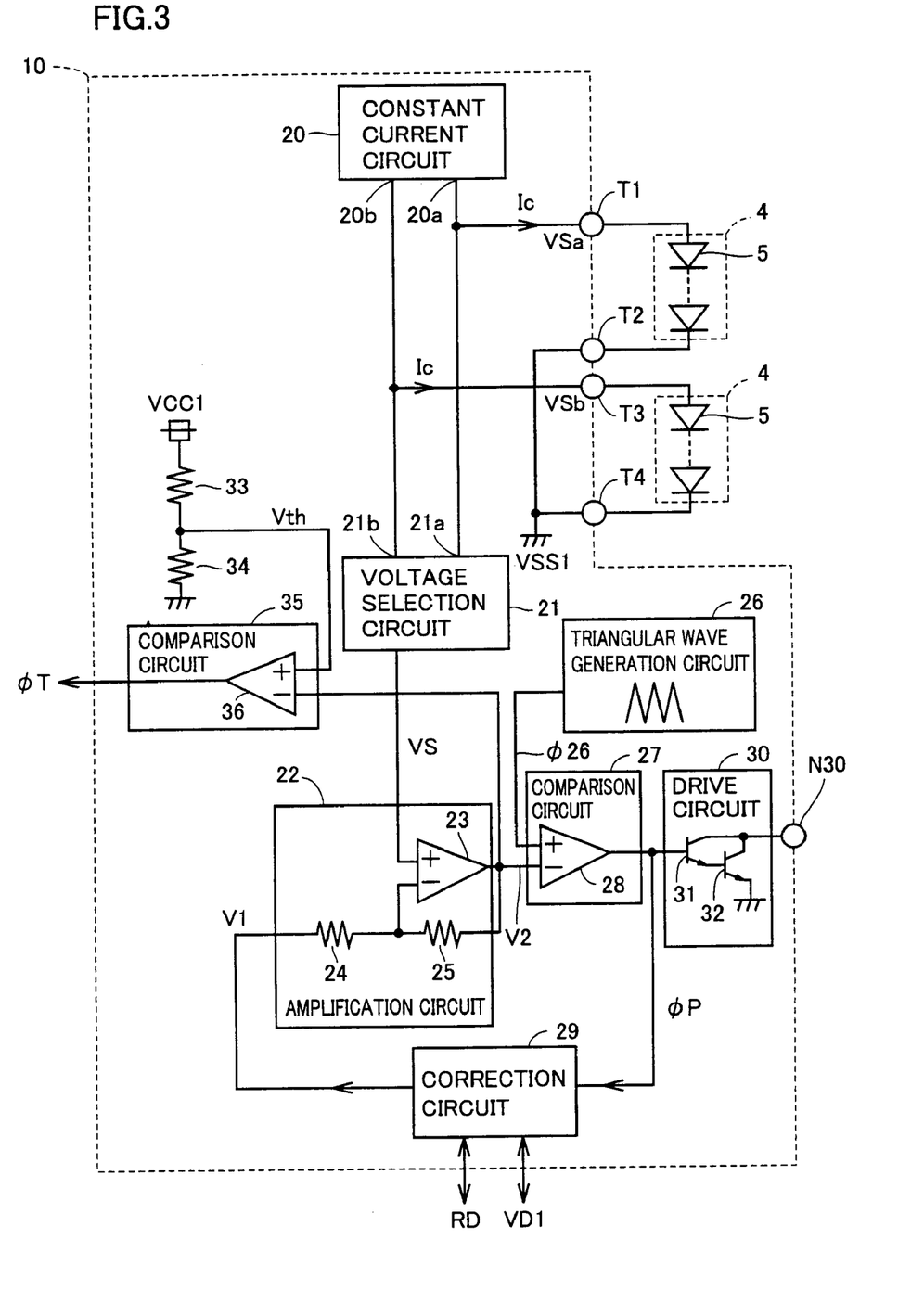
FIG. 3 is a circuit block diagram showing a structure of a PWM (pulse width modulation) signal generation circuit shown in FIG. 2.

FIG. 3 is a circuit block diagram showing a structure of PWM signal generation circuit 10. In FIG. 3, PWM signal generation circuit 10 includes a constant current circuit 20, a voltage selection circuit 21, an amplification circuit 22, a triangular wave generation circuit 26, comparison circuits 27 and 35, a correction circuit 29, a drive circuit 30, and resistive elements 33 and 34.

Terminals T1 and T3 are connected to output terminals 20$a$ and 20$b$ of constant current circuit 20, respectively, and also connected to input terminals 21$a$ and 21$b$ of voltage selection circuit 21, respectively. Terminals T2 and T4 are both connected to a line of a first ground voltage VSS1. Constant current circuit 20 supplies a constant current Ic to each of two temperature sensors 4. Thereby, voltages VSa and VSb, each having a value obtained by multiplying the resistance of corresponding temperature sensor 4 by constant current Ic, are generated at terminals T1 and T3, respectively.

Figure 4:
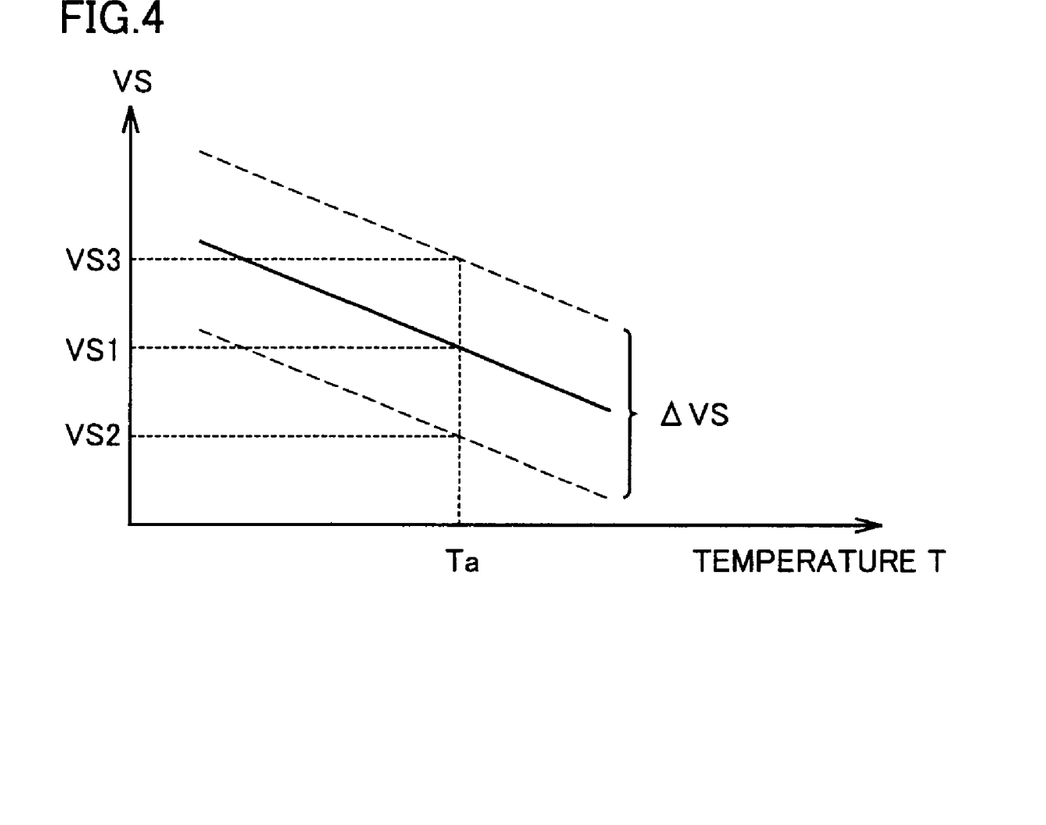
FIG. 4 shows a characteristic of a temperature sensor shown in FIG. 3.

As shown in FIG. 4, for example voltage VSa at terminal T1 decreases in proportion to an increase in a temperature T. In temperature sensor 4 having standard characteristics, a voltage VS attains a value VS1 when temperature T has a value Ta. However, individual temperature sensors 4 have characteristic variations, which are generally within a range defined by a standard or the like, that is, a range between a lower limit value VS2 and an upper limit value VS3, and having a magnitude ΔVS that is equal to VS3−VS2. Since chips 1 and 2 having substantially identical characteristics are generally selected and used within one IPM as described above, characteristic variations in temperature sensors 4 within one IPM are negligible. In a plurality of IPMs, however, variations in ΔVS are caused.

During normal temperature detection (in the normal mode), voltage selection circuit 21 selects the lower of voltages VSa and VSb at its input terminals 21$a$ and 21$b$, that is, voltage VS indicating a higher temperature, and supplies the selected voltage VS to amplification circuit 22. Further, in the adjustment mode, voltages VSa and VSb are basically substantially identical, and thus voltage selection circuit 21 supplies a voltage at a predetermined input terminal to amplification circuit 22. Amplification circuit 22 includes an operational amplifier 23 and resistive elements 24 and 25. Operational amplifier 23 has a non-inverting input terminal receiving output voltage VS of voltage selection circuit 21. Resistive element 24 has one electrode receiving an output voltage V1 of correction circuit 29, and the other electrode connected to an inverting input terminal of operational amplifier 23. Resistive element 25 is connected between the inverting input terminal and an output terminal of operational amplifier 23. Amplification circuit 22 supplies an output voltage V2 represented as follows:

$$V2 = VS + (VS - V1) \times (R25/R24),$$

where R24 and R25 are resistances of resistive elements 24 and 25, respectively.

Figure 5:
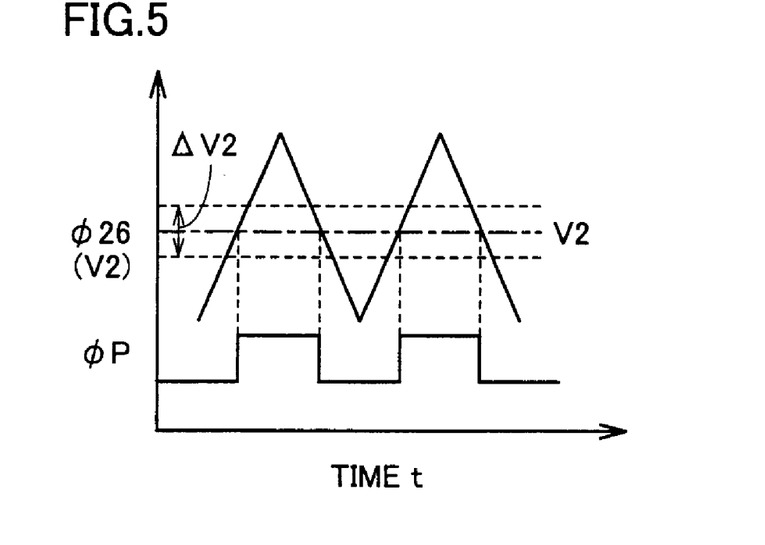
FIG. 5 is a time chart showing operations of a triangular wave generation circuit and a comparison circuit shown in FIG. 3.

Triangular wave generation circuit 26 generates a triangular wave signal φ26 with a predetermined frequency. Comparison circuit 27 compares triangular wave signal φ26 with output voltage V2 of amplification circuit 22, and outputs a PWM signal φP based on the comparison result. Specifically, comparison circuit 27 includes a comparator 28. Comparator 28 has a non-inverting input terminal receiving triangular wave signal φ26, and an inverting input terminal receiving output voltage V2 of amplification circuit 22. As shown in FIG. 5, output signal φP of comparator 28 attains an "H" level when triangular wave signal φ26 has a level higher than that of voltage V2, and attains an "L" level when triangular wave signal φ26 has a level lower than that of voltage V2.

It is to be noted that, in the case where an output of temperature sensor 4 is measured in the normal mode, temperature detection can be performed with higher accuracy as triangular wave signal φ26 has a higher frequency. In the adjustment mode, however, the pulse width of signal φP generated from triangular wave signal φ26 is measured by counting the number of pulses of a clock signal CLK described later, and thus temperature detection can be performed with higher accuracy as triangular wave signal φ26 has a lower frequency. The frequency of triangular wave signal φ26 should be determined taking these two conditions into account.

When temperature T of switching element 3 increases and output voltage V2 of amplification circuit 22 decreases, PWM signal φP has a wider pulse width. In contrast, when temperature T of switching element 3 decreases and output voltage V2 of amplification circuit 22 increases, PWM signal φP has a narrower pulse width.

Due to characteristic variations in temperature sensor 4 and characteristic variations in electronic components such as operational amplifier 23, output voltage V2 of amplification circuit 22 varies within a width ΔV2, and the pulse width of PWM signal φP also varies. Correction circuit 29 sets voltage V1 such that the pulse width of PWM signal φP is set to the reference pulse width in the adjustment mode.

Figure 6:
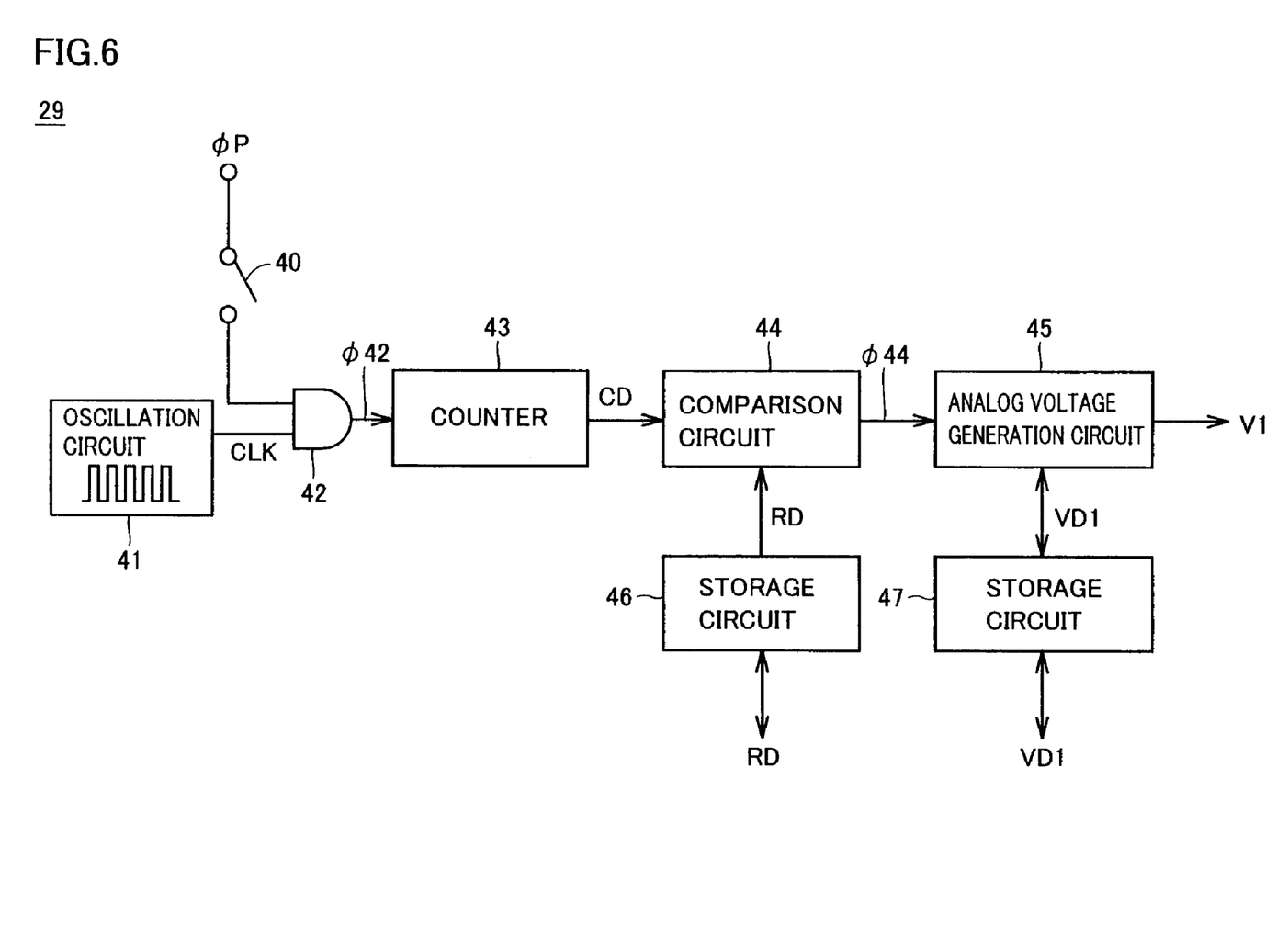
FIG. 6 is a circuit block diagram showing a structure of a correction circuit shown in FIG. 3.

As shown in FIG. 6, correction circuit 29 includes a switch 40, an oscillation circuit 41, an AND gate 42, a counter 43, a comparison circuit 44, an analog voltage generation circuit 45, and storage circuits 46 and 47. Switch 40 has one terminal receiving PWM signal φP, and the other terminal connected to one input node of AND gate 42. Switch 40 is turned ON during a period of pulse width correction in the adjustment mode, and turned OFF during a period other than that, including a period of the normal mode.

Figure 7:
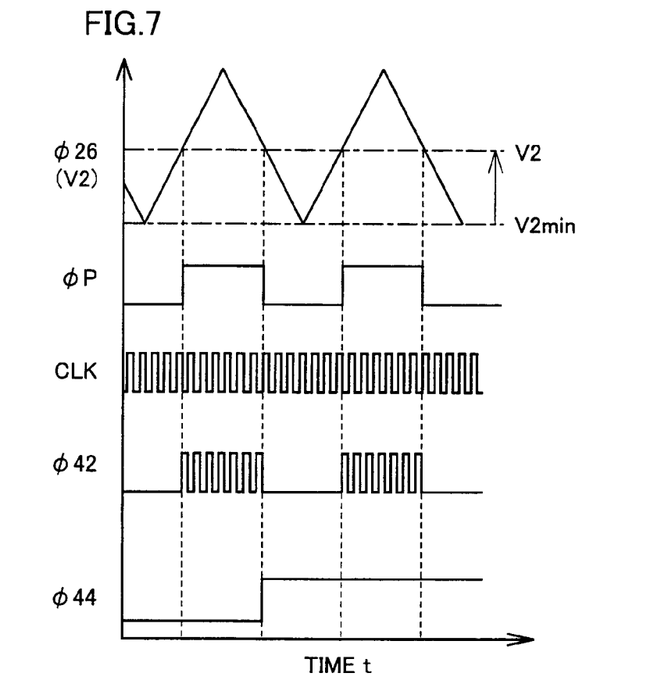
FIG. 7 is a time chart showing operation of the correction circuit shown in FIG. 6.

Oscillation circuit 41 is activated during the period of pulse width correction, and generates clock signal CLK with a predetermined frequency as shown in FIG. 7. Clock signal CLK is supplied to the other input node of AND gate 42. AND gate 42 passes clock signal CLK only during a period in which switch 40 is ON and PWM signal φP is at an "H" level. Counter 43 receives an output signal φ42 of AND gate 42, counts the number of pulses from when PWM signal φP rises to an "H" level to when PWM signal φP falls to an "L" level, and outputs a data signal CD (having a multi-bit configuration) indicating the counted value.

Although temperature detection can be performed with higher accuracy as clock signal CLK has a higher frequency, the frequency of clock signal CLK should be determined paying attention to possible occurrence of noise due to a high frequency.

Storage circuit 46 stores a reference count value as data signal RD. The reference count value is a count value of counter 43 when the pulse width of PWM signal φP is set to the reference pulse width obtained when switching element 3 and temperature sensor 4 serving as characteristic references are caused to have the reference temperature. Data signal RD may be determined based on statistical data measured by using a plurality of temperature sensors 4 beforehand, a calculated value determined by a standard, and the like and in conformity with IPM specifications, and is rewritable and readable as described above. Comparison circuit 44 compares output data signal CD of counter 43 with data signal RD stored in storage circuit 46. In response to coincidence of data signal CD and data signal RD, an output signal φ44 of comparison circuit 44 rises from an "L" level to an "H" level as shown in FIG. 7.

Figure 8:
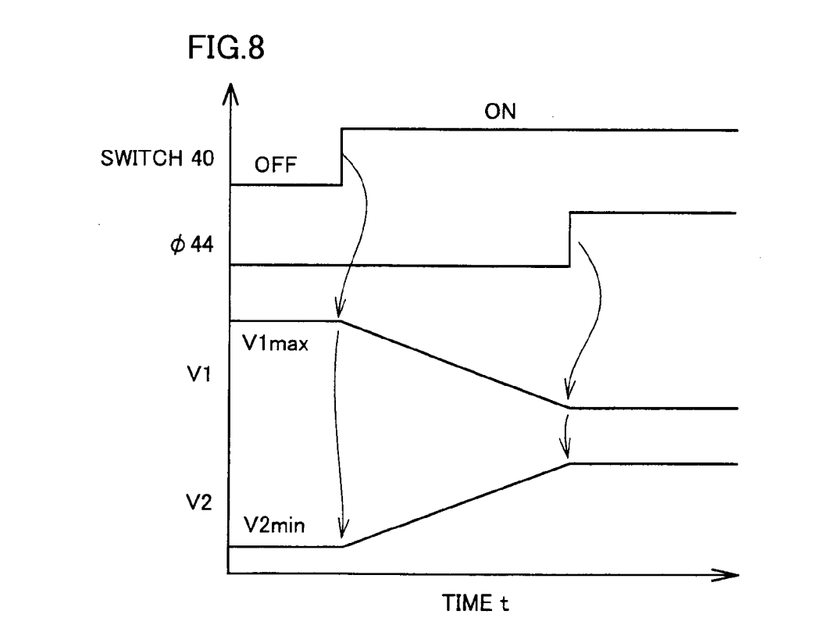
FIG. 8 is another time chart showing operation of the correction circuit shown in FIG. 6.

As shown in FIG. 8, analog voltage generation circuit 45 starts operation of the adjustment mode (operation during the period of pulse width correction) in response to turning ON of switch 40, gradually decreases analog voltage V1 from its maximum value V1max, and then fixes analog voltage V1 at a constant value in response to rising of output signal φ44 of comparison circuit 44 from an "L" level to an "H" level. It is to be noted that analog voltage V1 may be decreased step by step in the same cycle as PWM signal φP (or triangular wave signal φ26). When analog voltage V1 is gradually decreased from the maximum value V1max in this manner, output voltage V2 of amplification circuit 22 gradually increases from its minimum value V2min. When analog voltage V1 is fixed at a constant value, voltage V2 is also fixed at a constant value, and the pulse width of PWM signal φP at the predetermined reference temperature is fixed to the reference pulse width.

Further, analog voltage generation circuit 45 causes storage circuit 47 to store data signal VD1 indicating the fixed analog voltage V1, and outputs in the normal mode analog voltage V1 indicated by data signal VD1 stored in storage circuit 47. Data signal VD1 is rewritable and readable as described above.

Turning back to FIG. 3, drive circuit 30 includes two Darlington-connected NPN bipolar transistors 31 and 32. When PWM signal φP is at an "H" level, transistors 31 and 32 become conductive and an output node N30 attains an "L" level (the first ground voltage VSS1), and when PWM signal φP is at an "L" level, transistors 31 and 32 become nonconductive and output node N30 is placed in a high-impedance state.

Resistive elements 33 and 34 are connected in series between a line of the first power supply voltage VCC1 and the line of the first ground voltage VSS1 to divide the first power supply voltage VCC1 and generate a threshold voltage Vth. Comparison circuit 35 includes a comparator 36, and sets a signal φT indicating an abnormal increase in the temperature of switching element 3 to an "H" level, which is an activation level, when output voltage V2 of amplification circuit 22 is decreased lower than threshold voltage Vth. Signal φT is used as an emergency stop signal for a drive circuit of switching element 3 or an alarm signal for a control circuit in a higher level.

Figure 9:
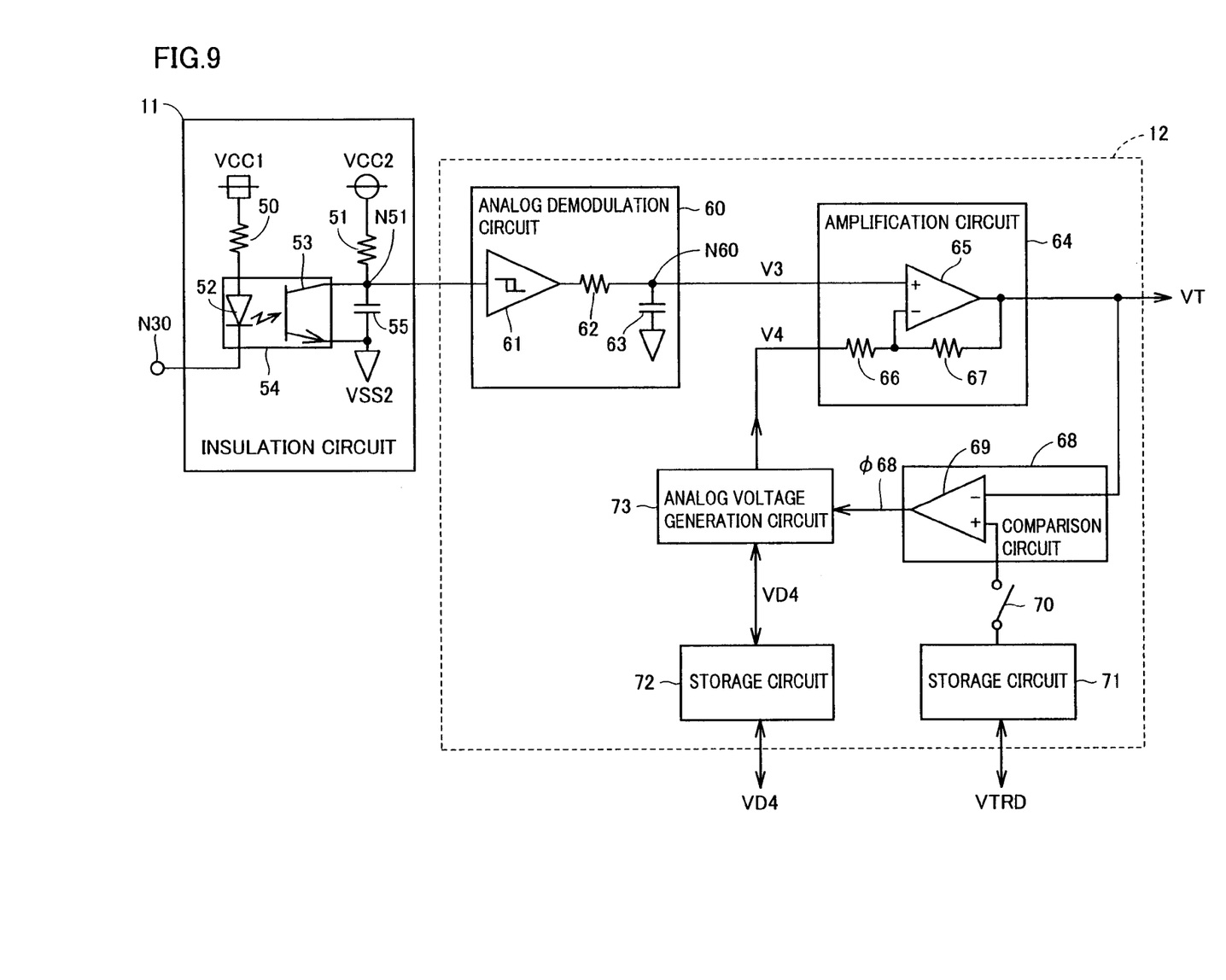
FIG. 9 is a circuit block diagram showing structures of an insulation circuit and a temperature voltage generation circuit shown in FIG. 2.

FIG. 9 is a circuit block diagram showing structures of insulation circuit 11 and temperature voltage generation circuit 12 shown in FIG. 2. In FIG. 9, insulation circuit 11 includes resistive elements 50 and 51, a photocoupler 54 including a light emitting diode (LED) 52 and a phototransistor 53, and a capacitor 55. Resistive element 50 and light emitting diode 52 are connected in series between the line of the first power supply voltage VCC1 and output node N30 of PWM signal generation circuit 10. Resistive element 51 is connected between a line of the second power supply voltage VCC2 and a node N51. Phototransistor 53 and capacitor 55 are connected in parallel between node N51 and a line of a second ground voltage VSS2.

When PWM signal φP is at an "L" level and node N30 is in a high-impedance state, no current flows through light emitting diode 52 and thus phototransistor 53 becomes nonconductive, and a current flows from the line of the second power supply voltage VCC2 via resistive element 51 to node N51, which results in an increase in the voltage at node N51.

When PWM signal φP is at an "H" level and node N30 is at an "L" level, a current flows from the line of the first power supply voltage VCC1 via resistive element 50 and light emitting diode 52 to node N30, and the resistance of phototransistor 53 is reduced and thus a current flows from node N51 via phototransistor 53 to the line of the second ground voltage VSS2, which results in a decrease in the voltage at node N51. Accordingly, the voltage at node N51 is set at a level in accordance with the pulse width of PWM signal φP.

Temperature voltage generation circuit 12 includes an analog demodulation circuit 60, an amplification circuit 64, a comparison circuit 68, a switch 70, storage circuits 71 and 72, and an analog voltage generation circuit 73. Analog demodulation circuit 60 includes a buffer 61, a resistive element 62, and a capacitor 63. Buffer 61 outputs a voltage in accordance with the voltage at output node N51 in insulation circuit 11. Resistive element 62 has one electrode receiving the output voltage of buffer 61, and the other electrode connected to an output node N60. Capacitor 63 is connected between output node N60 and the line of the second ground voltage VSS2. A voltage V3 at output node N60 is obtained by integrating the output voltage of buffer 61.

Amplification circuit 64 includes an operational amplifier 65 and resistive elements 66 and 67. Operational amplifier 65 has a non-inverting input terminal receiving output voltage V3 of analog demodulation circuit 60. Resistive element 66 has one electrode receiving an output voltage V4 of analog voltage generation circuit 73, and the other electrode connected to an inverting input terminal of operational amplifier 65. Resistive element 67 is connected between the inverting input terminal and an output terminal of operational amplifier 65. Temperature voltage VT, which is the output voltage of amplification circuit 64, is represented as follows:

$$VT = V3 + (V3 - V4) \times (R67/R66),$$

where R66 and R67 are resistances of resistive elements 66 and 67, respectively.

When the pulse width of PWM signal φP is set to the reference pulse width during the period of pulse width correction in the adjustment mode as described above, temperature voltage VT also varies due to the characteristic variations in the electronic components constituting insulation circuit 11, analog demodulation circuit 60, and amplification circuit 64. Accordingly, correction of temperature voltage VT is performed also in temperature voltage generation circuit 12.

Specifically, storage circuit 71 stores data signal VTRD indicating a reference temperature voltage VTR when switching element 3 and temperature sensor 4 serving as characteristic references are caused to have the reference temperature. Data signal VTRD is rewritable and readable as described above. Switch 70 is connected between storage circuit 71 and comparison circuit 68, and turned ON during a period of temperature voltage correction in the adjustment mode. It is to be noted that switch 40 (FIG. 6) is turned OFF during the period of temperature voltage correction, and in contrast, switch 70 is turned OFF during the period of pulse width correction described above. When switch 70 is turned ON, data signal VTRD stored in storage circuit 71 is supplied to comparison circuit 68.

Figure 10:
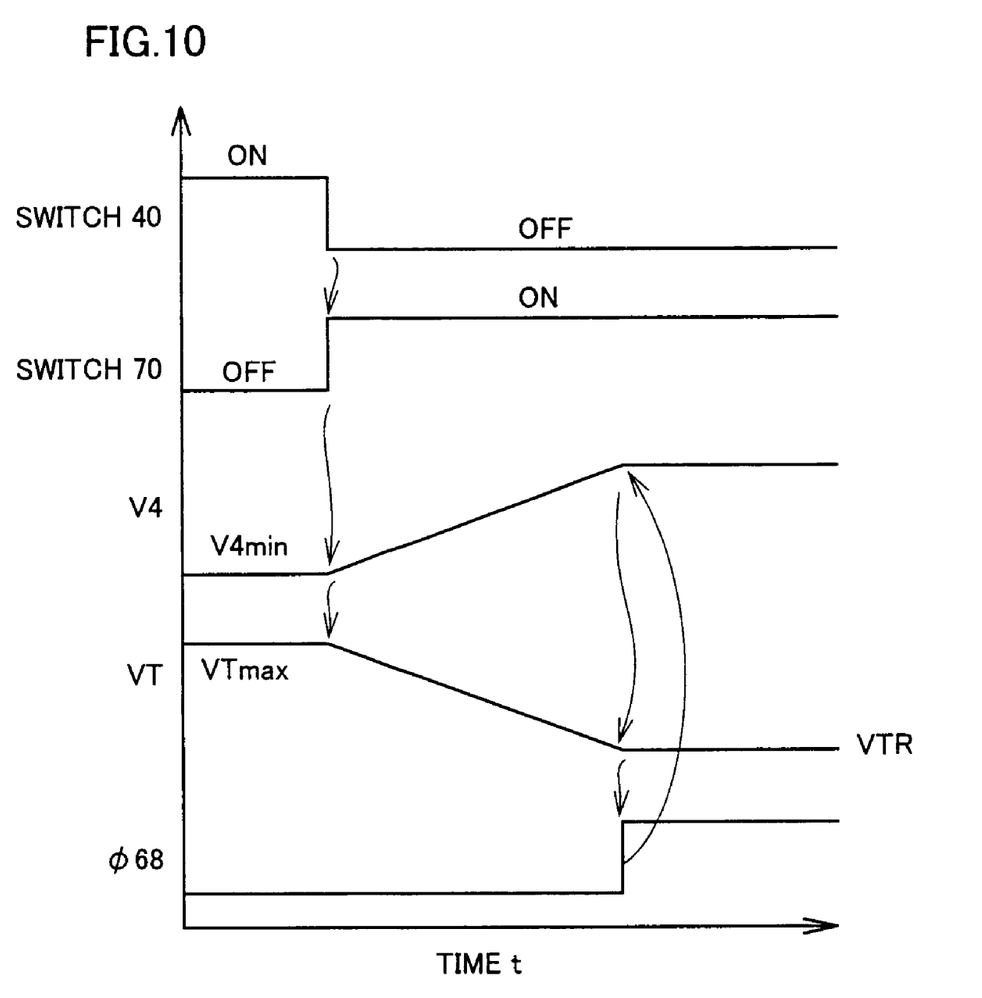
FIG. 10 is a time chart showing operation of the temperature voltage generation circuit shown in FIG. 9.

Comparison circuit 68 includes a comparator 69, compares temperature voltage VT with reference temperature voltage VTR obtained by converting data signal VTRD into an analog signal by a DA (digital-to-analog) conversion circuit provided in storage circuit 71, and causes a signal φ68 to rise from an "L" level to an "H" level when temperature voltage VT is reduced to reach reference temperature voltage VTR as shown in FIG. 10. Analog voltage generation circuit 73 gradually increases voltage V4 from its minimum value V4min in response to turning ON of switch 70 as shown in FIG. 10. As voltage V4 increases, temperature voltage VT gradually decreases from its maximum value VTmax. When temperature voltage VT reaches reference temperature voltage VTR, output signal φ68 of comparison circuit 68 rises from an "L" level to an "H" level, and consequently analog voltage generation circuit 73 fixes voltage V4 at a constant value. Thereby, temperature voltage VT coincides with reference temperature voltage VTR.

Further, analog voltage generation circuit 73 causes storage circuit 72 to store data signal VD4 indicating voltage V4 obtained when temperature voltage VT coincides with reference temperature voltage VTR. Data signal VD4 is rewritable and readable as described above. In the normal mode, switch 70 is turned OFF, and analog voltage generation circuit 73 supplies voltage V4 indicated by data signal VD4 stored in storage circuit 72 to amplification circuit 64.

Operation of the IPM will now be briefly described. In the adjustment mode, the IPM is accommodated in the constant-temperature bath to be kept at the reference temperature. Thereby, temperature sensor 4 has a resistance in accordance with the reference temperature.

When switch 40 of FIG. 6 is turned ON for example by an external control signal, correction of the pulse width of PWM signal φP is started. As shown in FIG. 8, when analog voltage V1 is gradually decreased from the maximum value V1max by analog voltage generation circuit 45 and the pulse width of PWM signal φP coincides with the reference pulse width, analog voltage V1 is fixed at a constant value. When analog voltage V1 is fixed, amplification circuit 22 has a fixed amplification ratio, and the pulse width of PWM signal φP is corrected to the reference pulse width. Thereby, characteristic variations in temperature sensor 4, constant current circuit 20, amplification circuit 22, triangular wave generation circuit 26, and comparison circuit 27 are corrected. Data signal RD indicating the reference pulse width of PWM signal φP and data signal VD1 indicating the set analog voltage V1 are stored in storage circuits 46 and 47, respectively. Since data signals RD and VD1 are rewritable and readable, their present values can be confirmed, changed, and fine-tuned externally.

Subsequently, when switch 40 is turned OFF and switch 70 of FIG. 9 is turned ON, correction of temperature voltage VT is started. As shown in FIG. 10, when analog voltage V4 is gradually increased from the minimum value V4min by analog voltage generation circuit 73 and temperature voltage VT coincides with reference temperature voltage VTR, analog voltage V4 is fixed at a constant value. When analog voltage V4 is fixed, amplification circuit 64 has a fixed amplification ratio, and temperature voltage VT is corrected to the reference temperature voltage. Thereby, characteristic variations in drive circuit 30, insulation circuit 11, analog demodulation circuit 60, and amplification circuit 64 are corrected. Data signal VTRD indicating reference temperature voltage VTR and data signal VD4 indicating the set analog voltage V4 are stored in storage circuits 71 and 72, respectively. Since data signals VTRD and VD4 are rewritable and readable, their present values can be confirmed, changed, and fine-tuned. After the adjustment mode is finished, the IPM is removed from the constant-temperature bath and switches 40 and 70 are turned OFF, and then the IPM is used like a typical IPM.

In the first embodiment, the amplification ratios of amplification circuits 22 and 64 are set such that temperature voltage VT coincides with reference temperature voltage VTR in the adjustment mode in which switching element 3 is caused to have the reference temperature. Thereby, characteristic variations in temperature sensor 4 and the like can be corrected, and the temperature of switching element 3 can be detected with high accuracy.

It is to be noted that, if PWM signal generating circuit 10 is formed of a function-intensive IC (integrated circuit) and temperature voltage generation circuit 12 is formed of another function-intensive IC, cost reduction can be achieved by the reduction in an mounting area and the reduction in the number of components.

Second Embodiment

Figure 11:
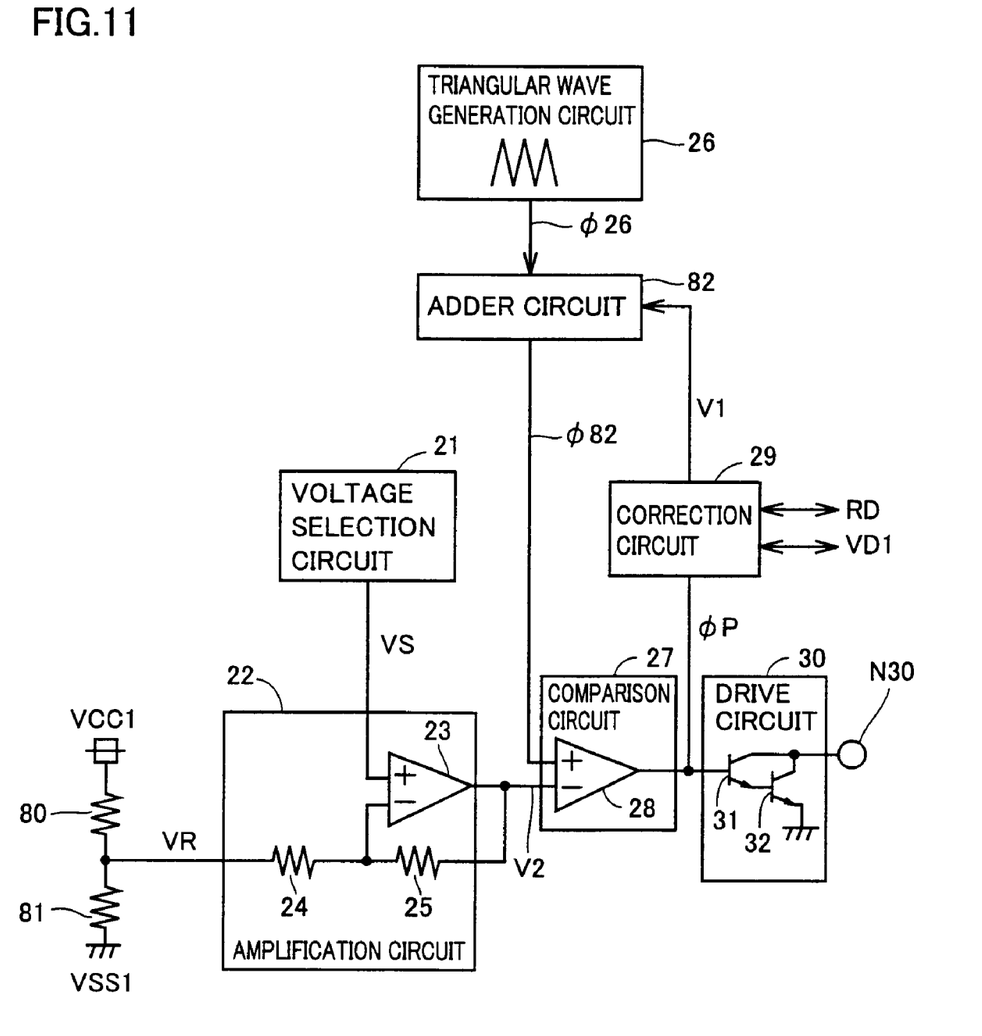
FIG. 11 is a circuit block diagram showing a main portion of a PWM signal generation circuit in an IPM in accordance with a second embodiment of the present invention.

FIG. 11 is a circuit block diagram showing a main portion of a PWM signal generation circuit in an IPM in accordance with a second embodiment of the present invention, which can be compared with FIG. 3. Referring to FIG. 11, the PWM signal generation circuit is different from PWM signal generation circuit 10 of FIG. 3 in that resistive elements 80 and 81 and an adder circuit 82 are added, amplification circuit 22 has a fixed amplification ratio, and output voltage V1 of correction circuit 29 is supplied to adder circuit 82. Resistive elements 80 and 81 are connected in series between the line of the first power supply voltage VCC1 and the first ground voltage VSS1 to divide the first power supply voltage VCC1 and generate reference voltage VR. Reference voltage VR is supplied to one electrode of resistive element 24 instead of analog voltage V1. Therefore, amplification circuit 22 has a fixed amplification ratio.

Adder circuit 82 adds output voltage V1 of correction circuit 29 to triangular wave signal φ26 generated by triangular wave signal generation circuit 26 to generate a triangular wave signal φ82, and supplies triangular wave signal φ82 to the non-inverting input terminal of comparator 28. Specifically, output voltage V1 of correction circuit 29 serves as a bias voltage to triangular wave signal φ82.

Figure 12:
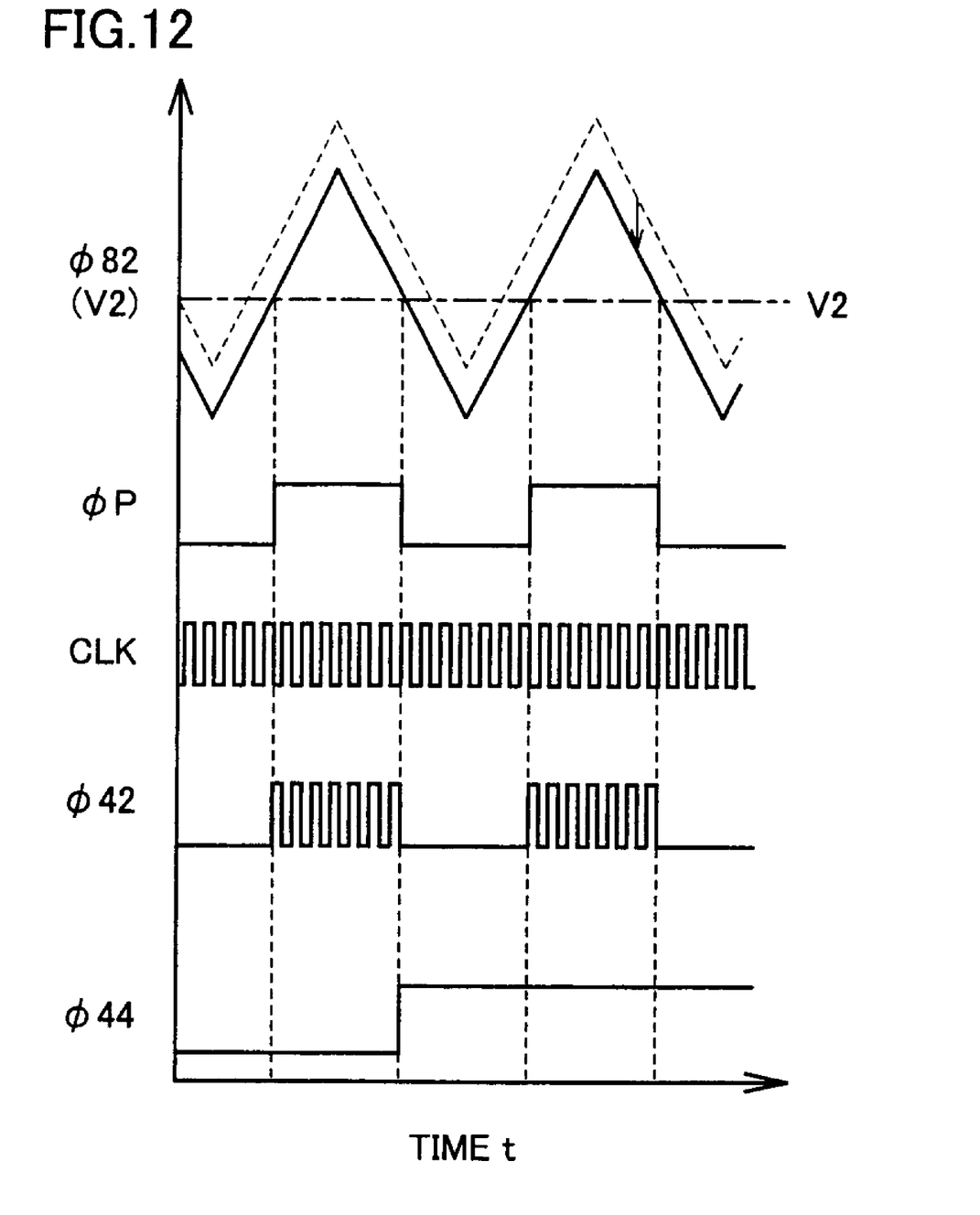
FIG. 12 is a time chart showing operation of the PWM signal generation circuit shown in FIG. 11.

FIG. 12 is a time chart showing operation of the PWM signal generation circuit, which can be compared with FIG. 7. During the period of pulse width correction in the adjustment mode, correction circuit 29 gradually decreases analog voltage V1 from the maximum value V1 max as shown in FIG. 8. Thereby, the bias voltage to triangular wave signal φ82 is gradually decreased, and triangular wave signal φ82 gradually moves downward in FIG. 12. Since output voltage V2 of amplification circuit 22 is constant, the pulse width of PWM signal φP is gradually reduced. When the number of pulses of clock signal CLK within one pulse width of PWM signal φP coincides with the number of pulses indicated by reference data RD, signal φ44 rises from an "L" level to an "H" level, and analog voltage V1 is fixed at a constant value. Thereby, the pulse width of PWM signal φP when switching element 3 is caused to have the reference temperature is corrected to the reference pulse width, and characteristic variations in temperature sensor 4 and the like are corrected.

The same effect as that in the first embodiment can also be obtained in the second embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A temperature detection circuit connected to a temperature sensor having a resistance varying in accordance with a temperature of a switching element, comprising:
    a pulse-width modulation (PWM) signal generation circuit which outputs a PWM signal indicating the temperature of said switching element based on the resistance of said temperature sensor and a correction value; and
    a correction circuit which sets said correction value such that, in an adjustment mode in which said switching element is caused to have a predetermined reference temperature, the PWM signal output from said PWM signal generation circuit indicates said reference temperature.

2. The temperature detection circuit according to claim 1, wherein said PWM signal generation circuit includes:
    a constant current circuit which supplies a constant current to said temperature sensor; and
    an amplification circuit which amplifies a voltage across terminals of said temperature sensor, and
    said correction value is an amplification ratio of said amplification circuit.

3. The temperature detection circuit according to claim 1, wherein said PWM signal generation circuit includes:
    a constant current circuit which supplies a constant current to said temperature sensor;
    an amplification circuit which amplifies a voltage across terminals of said temperature sensor;
    a triangular wave generation circuit which generates a triangular wave signal with a predetermined frequency; and
    a comparison circuit which compares said triangular wave signal with an output voltage of said amplification circuit and generates the PWM signal based on a comparison result, and
    said correction value is a bias voltage to said triangular wave signal.

4. The temperature detection circuit according to claim 1, wherein said correction circuit is formed of a semiconductor integrated circuit device.

5. The temperature detection circuit according to claim 1, comprising a storage circuit storing information indicating a reference signal to be output from said PWM signal generation circuit in said adjustment mode,
    wherein said correction circuit sets said correction value based on the information indicating said reference signal stored in said storage circuit and the PWM signal output from said PWM signal generation circuit.

6. The temperature detection circuit according to claim 5, wherein the information indicating said reference signal stored in said storage circuit is externally rewritable and readable.

7. The temperature detection circuit according to claim 1, comprising a storage circuit storing information indicating said correction value,
    wherein said signal generation circuit outputs the signal indicating the temperature of said switching element based on the resistance of said temperature sensor and the information indicating said correction value stored in said storage circuit.

8. The temperature detection circuit according to claim 7, wherein the information indicating said correction value stored in said storage circuit is externally rewritable and readable.

* * * * *